(12) United States Patent
Huang et al.

(10) Patent No.: US 8,447,046 B2
(45) Date of Patent: May 21, 2013

(54) CIRCUIT WITH THREE-STAGE OF POWER-ON SEQUENCE USED FOR SUPPRESSING THE POP NOISE IN AUDIO SYSTEM

(75) Inventors: Hsin-Chieh Huang, Taichung (TW); Yi-Lung Chen, Keelung (TW)

(73) Assignee: ISSC Technologies Corp., Hsinchu (TW)

( * ) Notice: Subject to any disclaimer, the term of this patent is extended or adjusted under 35 U.S.C. 154(b) by 386 days.

(21) Appl. No.: 13/005,609

(22) Filed: Jan. 13, 2011

(65) Prior Publication Data

US 2012/0183155 A1 Jul. 19, 2012

(51) Int. Cl.
*H04B 15/00* (2006.01)

(52) U.S. Cl.
USPC ......... 381/94.5; 381/94.7; 381/120; 381/123; 381/104; 381/94.1; 381/71.14; 381/94.6; 381/94.8; 330/9; 330/10; 330/251; 379/395

(58) Field of Classification Search
USPC .............. 381/94.5, 94.1, 94.7, 94.6, 94.8, 381/120, 123, 104; 330/9, 10, 251; 379/395; 700/94
See application file for complete search history.

(56) References Cited

U.S. PATENT DOCUMENTS

| | | | |
|---|---|---|---|
| 5,642,076 A | 6/1997 | Naokawa et al. | |
| 5,648,742 A * | 7/1997 | Ghaffaripour et al. | 330/51 |
| 6,040,740 A | 3/2000 | Dondale | |
| 6,157,726 A | 12/2000 | Carroll et al. | |
| 6,573,787 B2 * | 6/2003 | Ikin | 330/51 |
| 6,600,365 B1 * | 7/2003 | Frith | 330/51 |
| 6,774,684 B2 * | 8/2004 | Wu et al. | 327/134 |
| 6,775,387 B1 | 8/2004 | Mavencamp et al. | |
| 7,084,704 B2 | 8/2006 | Sowlati | |
| 7,154,332 B2 * | 12/2006 | Tsuchi | 330/255 |
| 7,164,312 B1 * | 1/2007 | Singh et al. | 330/9 |
| 7,259,619 B2 | 8/2007 | Chang et al. | |
| 7,498,881 B2 | 3/2009 | Wang | |
| 7,652,534 B1 * | 1/2010 | Lin et al. | 330/255 |
| 8,063,699 B2 * | 11/2011 | Fan et al. | 330/51 |
| 8,199,930 B2 * | 6/2012 | Wu | 381/94.5 |
| 2005/0151585 A1 * | 7/2005 | Honda et al. | 330/10 |
| 2006/0182265 A1 * | 8/2006 | Sorace et al. | 379/395 |
| 2009/0284314 A1 * | 11/2009 | Huang | 330/10 |

OTHER PUBLICATIONS

Protek devices, pop noise killer, Jun. 2009.*
Texas instrument, 25 mw directpath stereo headphone amplifier with pop suppression, Jul. 2009.*

* cited by examiner

*Primary Examiner* — Davetta W Goins
*Assistant Examiner* — Kuassi Ganmavo
(74) *Attorney, Agent, or Firm* — Ming Chow; Sinorica, LLC

(57) ABSTRACT

The present invention discloses a circuit with three-stage of power-on sequence used for suppressing the pop noise in audio system. It mainly comprises a first resistor ($R_1$); a capacitor ($C_{out}$); a first switch (SW1); a second switch (SW2); a soft start device; a first feedback amplifier; and a second feedback amplifier. By using the three-stage of power-on sequence, the present invention can effectively suppress the pop noise when the audio driver is power on.

9 Claims, 4 Drawing Sheets

CIRCUIT WITH THREE-STAGE OF POWER-ON SEQUENCE USED FOR SUPPRESSING THE POP NOISE IN AUDIO SYSTEM

BACKGROUND OF THE INVENTION

1. Field of the Invention

The present invention relates generally to a circuit used for suppressing the pop noise, and more particularly, to a circuit with three-stage of power-on sequence having a soft start device and two identical operational amplifier applied in the audio system.

2. Background

In many audio systems, the output of an audio device is coupled to a speaker via a capacitor, typically referred to as a direct current (DC) blocking or alternating current (AC) coupling capacitor. Usually, the output of an audio device consists of an audio signal and an associated DC offset voltage. Prior to turning on the audio device, the voltage across the AC coupling capacitor is typically zero (0) Volt. When the audio device is turned on, the audio device charges the AC coupling capacitor to the associated DC offset voltage.

The charging of the AC coupling capacitor produces a rising voltage that typically has frequency components within the human audible range. These frequency components typically produce undesirable noise at the output of the speaker, which is typically referred to in the relevant art as "click and pop" noise. Similarly, when the audio device is turned off, the charge on the AC coupling capacitor decays producing a falling voltage that typically also has frequency components within the human audible range. Again, these frequency components produce undesirable click and pop noise at the output of the speaker. This is better explained with reference to the following example "Pop" noise is also noticeable in other situations. One such situation is in the event of a brief power-down of the amplifier. Typically, one or more capacitors couple the speaker to the audio amplifier, to keep DC components from the amplifier output from propagating to the speaker. If this capacitance discharges too quickly on power-down, a "pop" effect in audible frequencies can be generated. Conversely, if this capacitance does not fully discharge on power-down, remaining charge on the capacitors upon the next power-up of the amplifier can cause a voltage surge that is sufficient to "pop" the speaker.

U.S. Pat. No. 5,537,081, issued to Naokawa et al. entitled "No turn-on pop noise amplifier" discloses an audio amplifier circuit in which the audio amplifier has an input stage that operates at zero common-mode input voltage, and has an output stage to provide the low voltage end of a voltage swing near ground. This reference also discloses a shunt circuit system to discharge external capacitors, preventing "pop" noise from residual charge at power-on. U.S. Pat. No. 5,642,074, issued to Ghaffaripour et al. entitled "Audio transient suppression device" discloses a feedback resistor of the amplifier is first bypassed during power-on period, and then restored once the reference signal of the amplifier is charged up to a predetermined voltage, so as to switch the gain of the amplifier to reduce the pops. U.S. Pat. No. 6,040,740, issued to Dondale, entitled "Audio transient suppression device" discloses a method of lessening or suppressing a transient voltage comprising the step of biasing an output node for an output signal. As shown in FIG. 1, the invention also includes a device for lessening a transient of an amplifier comprising a switch coupled to an output of the amplifier and a bias voltage source, wherein the switch is controllable to bias the output prior to the amplifier providing an amplified audio signal. The resistance of the switch can be variable to adjust the lessening of, or suppress, the transient. Instead of the switch, an impedance device can be used. The invention contemplates lessening or suppressing the transient by either adjusting the charge rate or the bias voltage of the node. Alternatively, both the charge rate and bias voltage can be adjusted to lessen or suppress the transient. This patent changes the gate voltage of device 240 to vary the charge rate of device 220 to suppress pop noise.

However, in order to lessen the pop noise, there is needed to provide a move effective method.

BRIEF SUMMARY OF THE INVENTION

It is an objective of the present invention to provide a circuit to suppress the pop noise in audio system by controlling the three-stage of power-on sequence.

To achieve the above objective, the present invention provides a circuit with three-stage of power-on sequence used for suppressing the pop noise in audio system, comprising: a first resistor ($R_1$); a capacitor ($C_{out}$); a first switch (SW1); a second switch (SW2); a soft start device; a first feedback amplifier; and a second feedback amplifier. The first resistor ($R_1$) has a first end with a voltage of $V_1$ and a second end with a voltage of $V_{out}$. The capacitor ($C_{out}$) has a first end electrically connected to the second end with the voltage of $V_{out}$ of the first resistor ($R_1$) and a second end electrically connected to a second resistor ($R_2$). The first switch (SW1) has a first end and a second end electrically connected to the first end with the voltage of $V_1$ of the first resistor ($R_1$), and is used for controlling the electronic signal passing or blocking. The second switch (SW2) has a first end and a second end electrically connected to the first end with the voltage of $V_1$ of the first resistor ($R_1$), and is used for controlling the electronic signal passing or blocking. The soft start device has an input end with a voltage of $V_{REF\_SSD}$ and an output end with a voltage of $V_{o1}$ electrically connected to the first end of the first switch (SW1), and is used for providing a specific voltage raised with small steps. The first feedback amplifier has an operational amplifier (OP1) having a first input end, a second input end with a voltage of $V_{REF\_OP1}$ and an output end with a voltage of $V_{O2}$, a first resistor ($R_3$) having a first end with a voltage of $V_{in}$ and a second end electrically connected to the second input end of the operational amplifier (OP1), a second resistor ($R_4$) with a first end electrically connected to the first input end of the operational amplifier (OP1) and a second end electrically connected to the output end with the voltage of $V_{O2}$ of the operational amplifier (OP1). The second feedback amplifier has an operational amplifier (OP2) having a first input end, a second input end with a voltage of $V_{REF\_OP2}$ and an output end with a voltage of $V_{O3}$, a first resistor ($R_3'$) with a first end with a voltage of $V_{in}$ and a second end electrically connected to the second input end of the operational amplifier (OP2), a second resistor ($R_4'$) with a first end electrically connected to the first input end of the operational amplifier (OP2) and a second end electrically connected to the output end with the voltage of $V_{O3}$ of the operational amplifier (OP2).

According to one aspect of the present invention, the first switch (SW1) and the second switch (SW2) can be replaced and selected from Bipolar Junction Transistor (BJT), Heterojunction Bipolar Transistor (HBT), High Electronic Mobility Transistor (HEMT), Pseudomorphic HEMT (PHEMT), Complementary Metal Oxide Semiconductor Filed Effect Transistor (CMOS) and Laterally Diffused Metal Oxide Semiconductor Filed Effect Transistor (LDMOS)

According to one aspect of the present invention, the soft start device can be composed by a pair of resistor and capacitor, a pair of current source and capacitor, and a counter raising an output voltage in small steps.

According to one aspect of the present invention, the first feedback amplifier (OP1) and the second feedback amplifier (OP2) are identical.

These and many other advantages and features of the present invention will be readily apparent to those skilled in the art from the following drawings and detailed descriptions.

BRIEF DESCRIPTION OF THE DRAWINGS

All the objects, advantages, and novel features of the invention will become more apparent from the following detailed descriptions when taken in conjunction with the accompanying drawings.

DETAILED DESCRIPTION OF THE INVENTION

Although the invention has been explained in relation to several preferred embodiments, the accompanying drawings and the following detailed descriptions are the preferred embodiment of the present invention. It is to be understood that the following disclosed descriptions will be examples of present invention, and will not limit the present invention into the drawings and the special embodiment.

Figure 3:
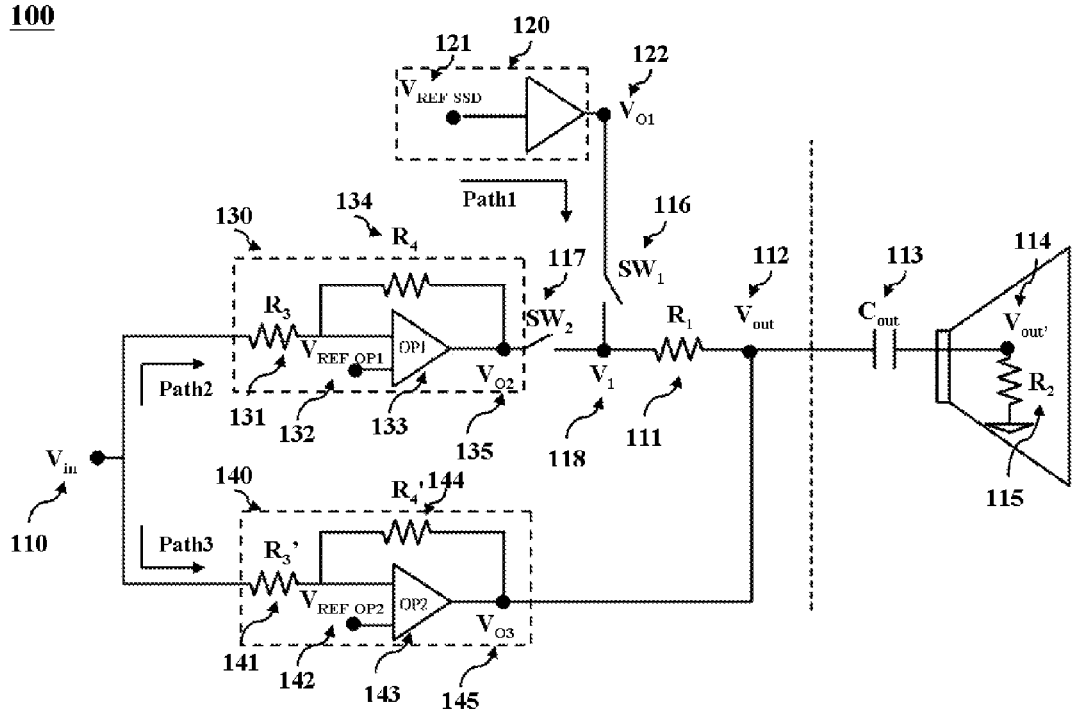
FIG. 3 shows a schematic of the circuit with three-stage of power-on sequence used for suppressing the pop noise in audio system 100 of the present invention.

To understand the spirit of the present invention, please referring to FIG. 3, it shows the schematic of the circuit with three-stage of power-on sequence used for suppressing the pop noise in the audio system according to the first embodiment of the present invention, wherein the circuit 100 comprises: a first resistor ($R_1$) 111, a capacitor ($C_{out}$) 113, a first switch (SW1) 116, a second switch (SW2) 117, a soft start device 120, a first feedback amplifier 130, and a second feedback amplifier 140.

All the devices in the circuit with three-stage of power-on sequence used for suppressing the pop noise in audio system 100 can be realized by using the 0.18 μm, 0.13 μm, 0.09 μm, 0.045 μm, 0.023 μm, 0.011 μm or the advanced process. The first resistor ($R_1$) 111 has a first end with a voltage of $V_1$ 118 and a second end with a voltage of $V_{out}$. The capacitor ($C_{out}$) 113 has a first end electrically connected to the second end with the voltage of $V_{out}$ 112 of the first resistor ($R_1$) 111 and a second end electrically connected to a second resistor ($R_2$) 115. In this invention, the second resistor ($R_2$) 115 is used to be equivalent to the audio device or the speaker. The first switch (SW1) 116 has a first end and a second end electrically connected to the first end with the voltage of $V_1$ 118 of the first resistor ($R_1$) 111, and is used for controlling the electronic signal passing or blocking. The second switch (SW2) 117 has a first end and a second end electrically connected to the first end with the voltage of $V_1$ 118 of the first resistor ($R_1$) 111, and is used for controlling the electronic signal passing or blocking. The soft start device 120 has an input end with a voltage of $V_{REF\_SSD}$ 121 and an output end with a voltage of $V_{o1}$ 122 electrically connected to the first end of the first switch (SW1) 116, and is used for providing a specific voltage raised with small steps.

It should be noted that the first switch (SW1) 116 and the second switch (SW2) 117 can be replaced and selected from Bipolar Junction Transistor (BJT), Heterojunction Bipolar Transistor (HBT), High Electronic Mobility Transistor (HEMT), Pseudomorphic HEMT (PHEMT), Complementary Metal Oxide Semiconductor Filed Effect Transistor (CMOS) and Laterally Diffused Metal Oxide Semiconductor Filed Effect Transistor (LDMOS).

Figure 1:
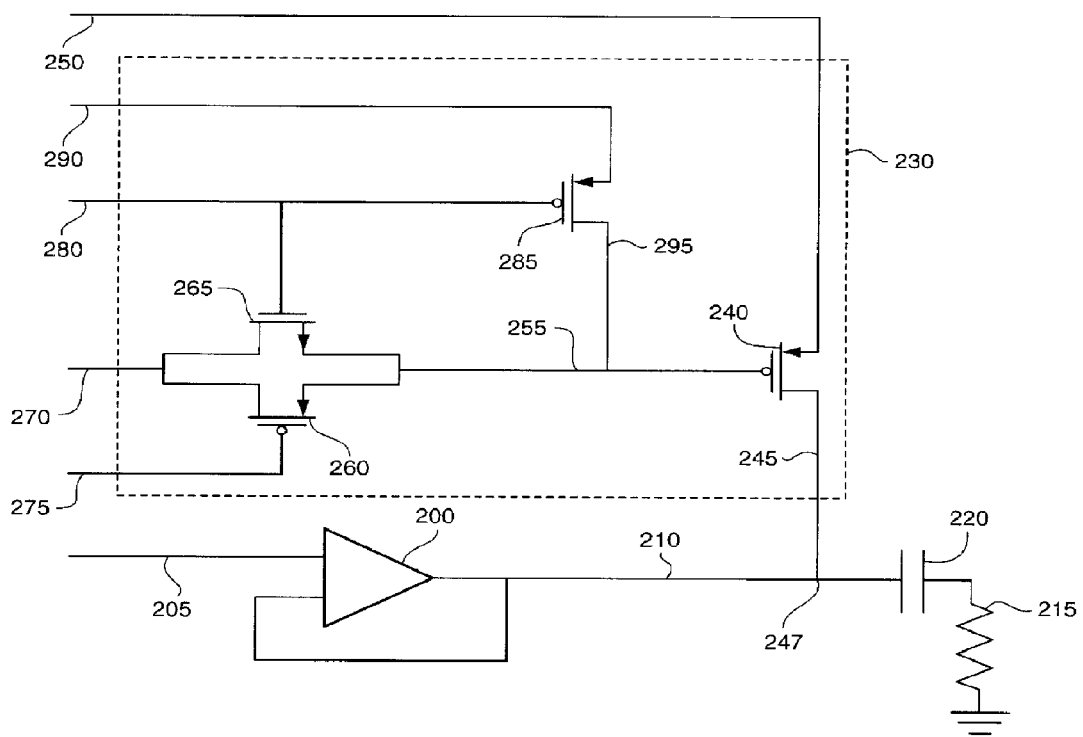
FIG. 1 shows a schematic of the circuit used for suppressing the pop noise in audio system of the prior art.
Figure 2:
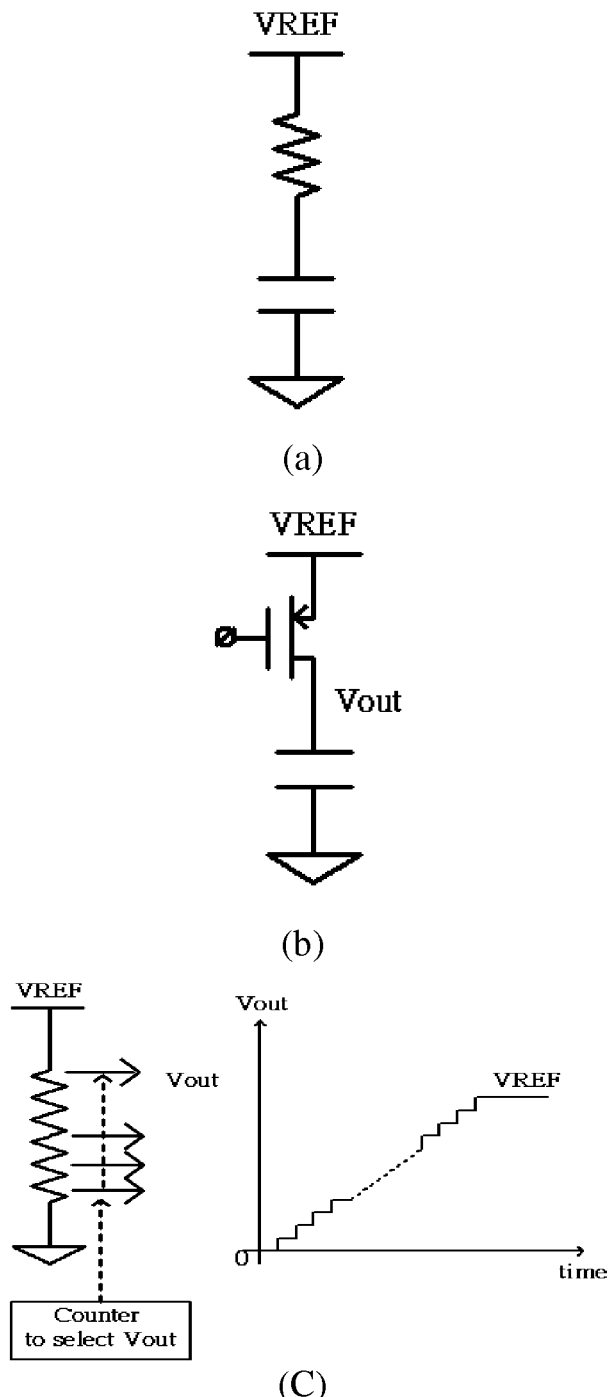
FIG. 2 shows a schematic of the different circuit of the soft start device 120 of the present invention.

Moreover, the main purpose of using the soft start device 120 in the circuit with three-stage of power-on sequence used for suppressing the pop noise in audio system 100 is to provide the voltage of $V_{REF}$ at the first end of the first resistor ($R_1$), which further can prevent the inrush current happening. In general, the inrush current happens in the instant while the audio driver is power on, besides, too high inrush current would result in the larger pop noise in the audio system. The soft start device 120 can be a pair of resistor and capacitor, or a pair of current source and capacitor, or a counter which is used to select an output voltage and raise the output voltage in small steps to be the voltage of $V_{REF}$, as shown in FIG. 2.

It should be note that the current source can be replaced and selected from Bipolar Junction Transistor (BJT), Heterojunction Bipolar Transistor (HBT), High Electronic Mobility Transistor (HEMT), Pseudomorphic HEMT (PHEMT), Complementary Metal Oxide Semiconductor Filed Effect Transistor (CMOS) and Laterally Diffused Metal Oxide Semiconductor Filed Effect Transistor (LDMOS).

The first feedback amplifier 130 has an operational amplifier (OP1) 133 having a first input end, a second input end with a voltage of $V_{REF\_OP1}$ 132 and an output end with a voltage of $V_{O2}$ 135, a first resistor ($R_3$) 131 having a first end with a voltage of $V_{in}$ 110 and a second end electrically connected to the second input end of the operational amplifier (OP1) 133, a second resistor ($R_4$) 134 with a first end electrically connected to the first input end of the operational amplifier (OP1) 133 and a second end electrically connected to the output end with the voltage of $V_{O2}$ 135 of the operational amplifier (OP1) 133.

The second feedback amplifier 140 has an operational amplifier (OP2) 143 having a first input end, a second input end with a voltage of $V_{REF\_OP2}$ 142 and an output end with a voltage of $V_{O3}$ 145, a first resistor ($R_3'$) 141 with a first end with a voltage of $V_{in}$ 110 and a second end electrically connected to the second input end of the operational amplifier (OP2) 143, a second resistor ($R_4'$) 144 with a first end electrically connected to the first input end of the operational amplifier (OP2) 143 and a second end electrically connected to the output end with the voltage of $V_{O3}$ 145 of the operational amplifier (OP2) 143. In a special case, the elements in the first feedback amplifier (OP1) 133 and the elements in the second feedback amplifier (OP2) 143 are identical. Namely, the first feedback amplifier (OP1) 133 and the second feedback amplifier (OP2) 143 are identical.

Now please refer to FIG. 3 again, the three-stage circuit in the invention is interpreted as the soft start device 120, the first resistor 111, and the two identical feedback amplifiers, namely, the first feedback amplifier 130 and the second feedback amplifier 140. The operating manners of the three-stage circuit which can suppress the pop noise effectively are described as following.

At the beginning, the audio driver is power off, that is, the input audio voltage of $V_{in}$ 110 is 0V. The voltage of $V_{REF\_SSD}$ 121 and $V_{REF\_OP1}$ 132 are set as $V_{REF}$ and ready to activate the soft start device 120 and the operational amplifier (OP1) 133, and the first switch (SW1) 116 is in ON state. In the other hand, the soft start device 120, the second switch (SW2) 117, the operational amplifier (OP1) 133 and operational amplifier (OP2) 143 are in the OFF state.

While the audio driver is power on, the pop noise is the operating state of the first switch (SW1) 116, the second switch (SW2) 117, the soft start device 120, the operational amplifier (OP1) 133 and operational amplifier (OP2) 143 can be characterized as three conditions, which forms the power-on sequence in the invention.

In the first condition of the power-on sequence, the first switch (SW1) 116, the soft start device 120 and the operational amplifier (OP1) 133 are in ON state, whereas the second switch (SW2) 117 and the operational amplifier (OP2) 143 are in OFF state. Under this condition, the soft start device 120 would charge the capacitor ($C_{out}$) 113 from 0V to $V_{REF}$ slowly, moreover, the operational amplifier (OP1) 133 would also ready to output a voltage of $V_{REF}$ at the output end of the operational amplifier (OP1) 133, namely, the voltage of $V_{O2}$ 135 is equal to $V_{REF}$.

In the second condition of the power-on sequence, the second switch (SW2) 117 and the operational amplifier (OP1) 133 are in ON state, whereas the first switch (SW1) 116, the soft start device 120 and the operational amplifier (OP2) 143 are in OFF state. It should be noted that the state of the first switch (SW1) 116 and the second switch (SW2) 117 are changed at the same time. Since the voltage of $V_{out}$ 112 is charged through the first resistor ($R_1$) 111, the voltage of $V_{O1}$ 122 and the voltage of $V_{out}$ have to satisfy the relation of:

$$V_{out}=V_{in} \times (1-\exp(-t/RC)) \tag{1}$$

where the resistance magnitude of the R in the Equation (1) is the resistance magnitude of the first resistor ($R_1$) 111 and the capacitance magnitude of the C in the Equation (1) is the capacitance of the capacitor ($C_{out}$) 113. The Equation (1) results in the voltage difference between and the voltage of $V_{O1}$ 122 and the voltage of $V_{O2}$ 135.

In order to reducing the charge time of the capacitor ($C_{out}$) 113 charged by the soft start device 120, the capacitance magnitude of the capacitor ($C_{out}$) 113 and the resistance magnitude of the first resistor ($R_1$) 111 have to satisfy the relation of (suppose settle error is smaller than 0.1 VREF):

$$\ln(0.1) \times R_1 \times C_{out} \leq -t_{max} \tag{2}$$

where $t_{max}$ is the maximum acceptable waiting time for power-on.

One thing further should be noted is that the resistance magnitude of the first resistor ($R_1$) 111 and the resistance magnitude of the second resistor ($R_2$) 115, the voltage difference between the output end with the voltage of $V_{O1}$ 122 of the soft start device 120 and the output end with the voltage of $V_{O2}$ 135 of the operational amplifier (OP1) 133 have to satisfy the relation of:

$$(V_{O1}-V_{O2}) \times R_2/(R_1+R_2) \leq V_{max} \tag{3}$$

where $V_{max}$ is a maximum acceptable voltage crossing the second resistor ($R_2$) 115. The maximum acceptable voltage crossing the second resistor ($R_2$) 115, $V_{max}$, can be very small, which effectively make the smaller pop noise heard by ear.

In the third condition of the power-on sequence, the second switch (SW2) 117 and the operational amplifier (OP2) 143 are in ON state, whereas the first switch (SW1) 116, the soft start device 120 and the operational amplifier (OP1) 133 are in OFF state. It should be noted that the operational amplifier (OP1) 133 and the operational amplifier (OP2) 143 changed at the same time. Since the operational amplifier (OP1) 133 and the operational amplifier (OP2) 143 are identical, the voltage difference between the voltage of $V_{O2}$ 135 of operational amplifier (OP1) 133 and the voltage of $V_{O3}$ 145 of the operational amplifier (OP2) 143 is very small, which is hard to heard by ear. Under this condition, the main audio signal would propagate according to the operational amplifier (OP2) 143, the capacitor ($C_{out}$) 113 and the second resistor ($R_2$) 115.

Figure 4:
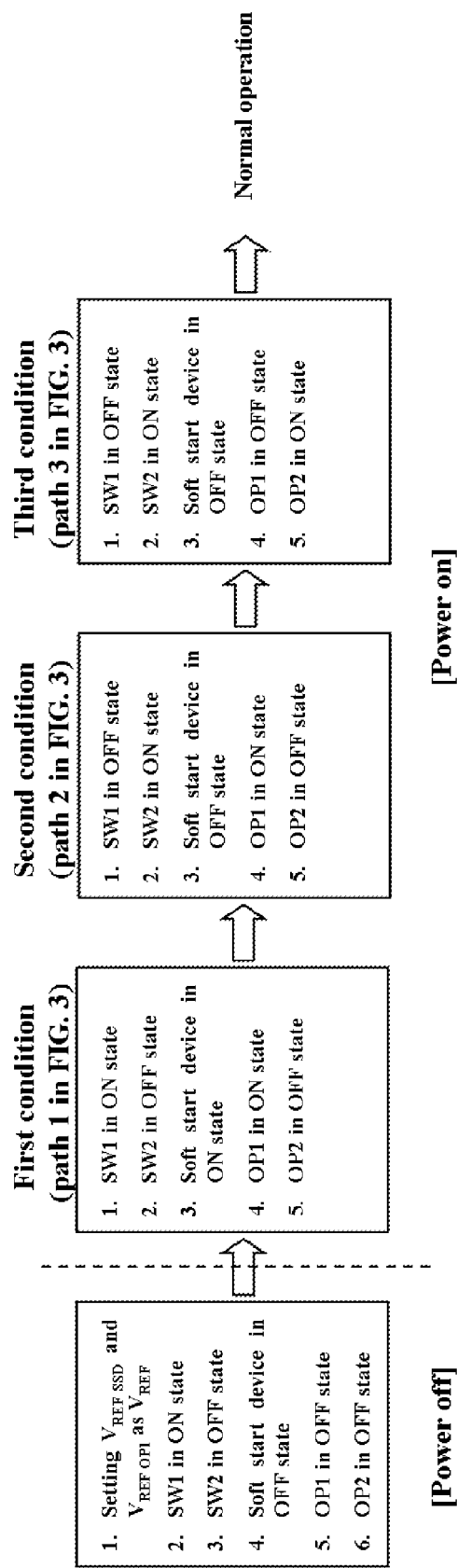
FIG. 4 shows a schematic of the operating flow chart of the circuit with three-stage of power-on sequence used for suppressing the pop noise in audio system 100 of the present invention.

In order to further understanding the description mentioned above, please refer to FIG. 4 and FIG. 3 at the same time. FIG. 4 is the schematic of the operating flow chart of the circuit with three-stage of power-on sequence used for suppressing the pop noise in audio system 100 of the present invention. The state of each of the component and device is clearly exhibited in the operation flow chart. At the beginning, there are not any voltages across the component and device since the audio driver is power off. While the audio driver is power on, the power-on sequence can be characterized as three conditions. In the first condition, the capacitor ($C_{out}$) 113 is charged by the soft start device 120 according to the path 1 shown in FIG. 3, wherein the maximum acceptable waiting time for power-on, $t_{max}$, is dominated by the first resistor ($R_1$) 111. The capacitance magnitude of the capacitor ($C_{out}$) 113 and the resistance magnitude of the first resistor ($R_1$) 111 have to satisfy the relation of Equation (2). In the second condition, the operational amplifier (OP1) 133 is responded in propagating the inrush current while the second switch (SW2) 117 is in ON state. The pop noise produced by the voltage difference between the voltage difference between the output end with the voltage of $V_{O1}$ 122 of the soft start device 120 and the output end with the voltage of $V_{O2}$ 135 of the operational amplifier (OP1) 133 can be effectively suppressed by making the magnitude of the first resistor ($R_1$) 111 and the second resistor ($R_2$) 115, the voltage difference between the output end with the voltage of $V_{O1}$ 122 of the soft start device 120 and the output end with the voltage of $V_{O2}$ 135 of the operational amplifier (OP1) 133 to satisfy the relation of Equation (3). In the third condition, in order to propagate the audio signal without resistor, R1 111, the operational amplifier (OP2) 143 is awakened while the second switch (SW2) 117 is in OFF state. Under this condition, the audio signal, $V_{in}$ 110, is mainly propagated according to the path 3 in FIG. 3. Finally, the audio signal, $V_{in}$ 110, can be heard without the pop noise.

The functions and the advantages of the present invention have been shown. Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A circuit with three-stage of power-on sequence used for suppressing the pop noise in audio system, comprising:
   a first resistor ($R_1$), having a first end with a voltage of $V_1$ and a second end with a voltage of $V_{out}$;
   a capacitor ($C_{out}$), having a first end electrically connected to the second end with the voltage of $V_{out}$ of the first resistor ($R_1$) and a second end electrically connected to a second resistor ($R_2$);
   a first switch (SW1), having a first end and a second end electrically connected to the first end with the voltage of $V_1$ of the first resistor ($R_1$), used for controlling the electronic signal passing or blocking;
   a second switch (SW2), having a first end and a second end electrically connected to the first end with the voltage of $V_1$ of the first resistor ($R_1$), used for controlling the electronic signal passing or blocking;

a soft start device, having an input end with a voltage of $V_{REF\_SSD}$ and an output end with a voltage of $V_{o1}$ electrically connected to the first end of the first switch (SW1), used for providing a specific voltage raised with small steps;

a first feedback amplifier, having an operational amplifier (OP1) having a first input end, a second input end with a voltage of $V_{REF\_OP1}$ and an output end with a voltage of $V_{O2}$, a first resistor ($R_3$) having a first end with a voltage of $V_{in}$ and a second end electrically connected to the second input end of the operational amplifier (OP1), a second resistor ($R_4$) with a first end electrically connected to the first input end of the operational amplifier (OP1) and a second end electrically connected to the output end with the voltage of $V_{O2}$ of the operational amplifier (OP1); and a second feedback amplifier, having an operational amplifier (OP2) having a first input end, a second input end with a voltage of $V_{REF\_OP2}$ and an output end with a voltage of $V_{O3}$, a first resistor ($R_3'$) with a first end with a voltage of $V_{in}$ and a second end electrically connected to the second input end of the operational amplifier (OP2), a second resistor ($R_4'$) with a first end electrically connected to the first input end of the operational amplifier (OP2) and a second end electrically connected to the output end with the voltage of $V_{O3}$ of the operational amplifier (OP2).

2. The circuit with three-stage of power-on sequence used for suppressing the pop noise in audio system as claimed in claim 1, wherein the first switch (SW1) and the second switch (SW2) can be replaced and selected from Bipolar Junction Transistor (BJT), Heterojunction Bipolar Transistor (HBT), High Electronic Mobility Transistor (HEMT), Pseudomorphic HEMT (PHEMT), Complementary Metal Oxide Semiconductor Filed Effect Transistor (CMOS) and Laterally Diffused Metal Oxide Semiconductor Filed Effect Transistor (LDMOS).

3. The circuit with three-stage of power-on sequence used for suppressing the pop noise in audio system as claimed in claim 1, wherein the soft start device is a pair of resistor and capacitor.

4. The circuit with three-stage of power-on sequence used for suppressing the pop noise in audio system as claimed in claim 1, wherein the soft start device is a pair of current source and capacitor.

5. The circuit with three-stage of power-on sequence used for suppressing the pop noise in audio system as claimed in claim 1, wherein the soft start device is a counter raising an output voltage in small steps.

6. The circuit with three-stage of power-on sequence used for suppressing the pop noise in audio system as claimed in claim 4, wherein the current source can be replaced and selected from Bipolar Junction Transistor (BJT), Heterojunction Bipolar Transistor (HBT), High Electronic Mobility Transistor (HEMT), Pseudomorphic HEMT (PHEMT), Complementary Metal Oxide Semiconductor Filed Effect Transistor (CMOS) and Laterally Diffused Metal Oxide Semiconductor Filed Effect Transistor (LDMOS).

7. The circuit with three-stage of power-on sequence used for suppressing the pop noise in audio system as claimed in claim 1, wherein the resistance magnitude of the first resistor ($R_1$) and the resistance magnitude of the second resistor ($R_2$), the voltage difference between the output end with the voltage of $V_{O1}$ of the soft start device and the output end with the voltage of $V_{O2}$ of the operational amplifier (OP1) have to satisfy the relation of $(V_{O1}-V_{O2}) \times R_2/(R_1+R_2) \leq V_{max}$, where $V_{max}$ is a maximum acceptable voltage crossing the second resistor ($R_2$).

8. The circuit with three-stage of power-on sequence used for suppressing the pop noise in audio system as claimed in claim 1, wherein the capacitance magnitude of the capacitor ($C_{out}$) and the resistance magnitude of the first resistor ($R_1$) have to satisfy the relation of $\ln(0.1) \times R_1 \times C_{out} \leq -t_{max}$, where $t_{max}$ is a maximum acceptable waiting time for power-on.

9. The circuit with three-stage of power-on sequence used for suppressing the pop noise in audio system as claimed in claim 1, wherein the first feedback amplifier (OP1) and the second feedback amplifier (OP2) are identical.

* * * * *